United States Patent
Asai et al.

(10) Patent No.: US 10,416,559 B2
(45) Date of Patent: Sep. 17, 2019

(54) FILM MATERIAL AND PATTERN FORMING PROCESS

(71) Applicant: Shin-Etsu Chemical Co., Ltd., Tokyo (JP)

(72) Inventors: Satoshi Asai, Annaka (JP); Kyoko Soga, Annaka (JP); Hideto Kato, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 105 days.

(21) Appl. No.: 15/783,176

(22) Filed: Oct. 13, 2017

(65) Prior Publication Data

US 2018/0107115 A1   Apr. 19, 2018

(30) Foreign Application Priority Data

Oct. 14, 2016   (JP) .................................. 2016-202294

(51) Int. Cl.
| | |
|---|---|
| *G03F 7/11* | (2006.01) |
| *G03F 7/075* | (2006.01) |
| *C08L 83/06* | (2006.01) |
| *C08L 83/14* | (2006.01) |
| *C09D 183/06* | (2006.01) |
| *C09D 183/14* | (2006.01) |
| *G03F 7/038* | (2006.01) |

(52) U.S. Cl.
CPC ............ *G03F 7/0752* (2013.01); *C08L 83/06* (2013.01); *C08L 83/14* (2013.01); *C09D 183/06* (2013.01); *C09D 183/14* (2013.01); *G03F 7/038* (2013.01); *G03F 7/0382* (2013.01); *G03F 7/0757* (2013.01); *G03F 7/11* (2013.01)

(58) Field of Classification Search
CPC ........ G03F 7/0575; G03F 7/091; G03F 7/092; G03F 7/094; G03F 7/09; G03F 7/11

USPC ....................................................... 430/271.1
See application file for complete search history.

(56) References Cited

U.S. PATENT DOCUMENTS

| | | | |
|---|---|---|---|
| 8,481,244 B2 | 7/2013 | Takeda et al. | |
| 2007/0275326 A1* | 11/2007 | Hatakeyama | G03F 7/11 430/270.1 |
| 2013/0196114 A1* | 8/2013 | Urano | G03F 7/0757 428/139 |
| 2013/0323631 A1 | 12/2013 | Asai et al. | |
| 2014/0255847 A1 | 9/2014 | Ohnishi et al. | |
| 2015/0219993 A1 | 8/2015 | Ito et al. | |
| 2018/0107116 A1* | 4/2018 | Asai | C08G 77/38 |

FOREIGN PATENT DOCUMENTS

| | | |
|---|---|---|
| EP | 2305754 A1 | 4/2011 |
| EP | 2602660 A1 | 6/2013 |
| JP | 2011-94115 A | 5/2011 |

OTHER PUBLICATIONS

Extended European Search Report dated Mar. 6, 2018, issued in counterpart European Application No. 17196307.7. (7 pages).

* cited by examiner

*Primary Examiner* — Cynthia Hamilton
(74) *Attorney, Agent, or Firm* — Westerman, Hattori, Daniels & Adrian, LLP

(57) ABSTRACT

A film material includes a support film having a transmittance of at least 60% with respect to light of wavelength 300-450 nm, and a resin layer containing 0.001-10 wt % of a basic compound with a molecular weight of up to 10,000, and having a thickness of 1-100 μm. A pattern is formed by attaching the resin layer in the film material to a chemically amplified negative resist layer on a wafer, exposing, baking, and developing the resist layer. The profile of openings in the pattern is improved.

7 Claims, No Drawings

FILM MATERIAL AND PATTERN FORMING PROCESS

CROSS-REFERENCE TO RELATED APPLICATION

This non-provisional application claims priority under 35 U.S.C. § 119(a) on Patent Application No. 2016-202294 filed in Japan on Oct. 14, 2016, the entire contents of which are hereby incorporated by reference.

TECHNICAL FIELD

This invention relates to a film material and a pattern forming process, and more particularly, to a film material containing a basic compound and a negative resist pattern forming process using the same.

BACKGROUND ART

As most electronic equipment including personal computers, digital cameras and mobile phones become of smaller size and better performance, there is an increasing demand for semiconductor devices of small size, thin profile and high density. There is a desire to have a photosensitive dielectric material which can accommodate an increase of substrate area for productivity improvement and which can accommodate structures having fine asperities with a high aspect ratio on substrates in the high-density packaging technology as typified by chip size packages or chip scale packages (CSP) or 3D layer stacks.

Recently, in the high-density packaging technology as typified by CSP or 3D stacked packages, a focus is put on the technique of redistribution from chips by forming a fine, high aspect ratio pattern on a substrate and depositing a metal such as copper on the pattern. To meet a demand for chips of higher density and higher integration, it is strongly desired in the redistribution technology to reduce the width of pattern lines and the size of contact holes for interconnection between substrates. The lithography is generally used for forming fine size patterns. In particular, the lithography combined with chemically amplified negative tone resist compositions is suited for forming fine pattern features. Since the pattern used for redistribution is permanently left between device chips, the pattern-forming material must have a cure ability and also serve as an electric/electronic part-protecting film having flexibility, heat resistance, electric properties, adhesion, reliability and chemical resistance. For this reason, a negative resist composition is believed suitable for forming such patterns.

Accordingly, a chemically amplified negative resist composition is typical of the pattern-forming material which can be processed into a fine redistribution layer and serve as an electric/electronic part-protecting film having flexibility, heat resistance, electric properties, adhesion, reliability and chemical resistance.

On the other hand, for the negative resist material in current use, it is desired to develop a material in which an opening profile is controlled in order to process a fine redistribution layer. Since the exposure dose for pattern formation increases with an increase of film thickness, the efficiency of acid generation of the photoacid generator in a surface layer relative to exposure is relatively high as compared with that in a bottom layer relative to exposure, suggesting that the profile of openings in the pattern surface layer is liable to assume T-top shape. If the T-top shape is included, they cause failures such as defects during coating formation by the subsequent redistribution processing step and cracks generated in the pattern in various environmental load tests. The cause of T-topping is that on use of a chemically amplified negative resist material, a pattern is formed by crosslinking by the acid generated upon exposure. The problem may be solved if an appropriate amount of basic component is available in the surface layer during pattern formation. The solution is difficult because even when a basic compound coexists in a composition, it is impossible to localize the basic compound in the surface layer.

CITATION LIST

Patent Document 1: JP-A 2011-094115 (U.S. Pat. No. 8,481,244, EP 2305754)

SUMMARY OF INVENTION

An object of the invention is to provide a film material which when combined with a chemically amplified negative resist material, enables to form a pattern having improved opening profile, and a pattern forming process using the film material.

The inventors have found that when a thin film containing a basic compound is formed on a pattern-forming surface, the basic component is effectively supplied to the surface layer during pattern formation, whereby the profile of openings is significantly improved.

In one aspect, the invention provides a film material comprising a support film having a transmittance of at least 60% with respect to light of wavelength 300 to 450 nm, and a resin layer disposed on one surface of the support film, containing 0.001 to 10% by weight of a basic compound with a molecular weight of up to 10,000, and having a thickness of 1 to 100 &nm.

In a preferred embodiment, the resin layer is based on a resin selected from the group consisting of an epoxy resin, phenolic resin, acrylic resin, silicone resin, polyester resin, polyurethane resin and polyamide resin.

More preferably, the resin layer is based on a siloxane skeleton-containing resin with a weight average molecular weight of 3,000 to 500,000.

In another aspect, the invention provides a pattern forming process comprising the steps of attaching the resin layer in the film material defined above to a chemically amplified negative resist layer on a wafer, exposing the resist layer to radiation, baking the exposed resist layer, and developing the baked resist layer.

Typically, the radiation used in the exposure step is radiation of wavelength 190 to 500 nm.

In a preferred embodiment, the chemically amplified negative resist layer comprises a siloxane skeleton-containing resin with a weight average molecular weight of 3,000 to 500,000.

In a preferred embodiment, the chemically amplified negative resist layer comprises:

(A) a siloxane skeleton-containing polymer represented by the formula (1) and having a weight average molecular weight of 3,000 to 500,000,

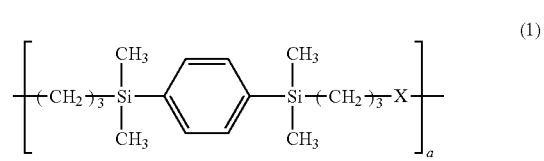

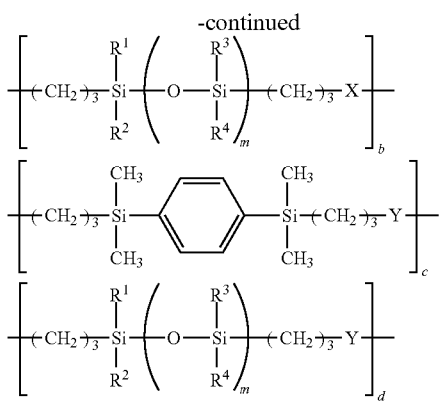

wherein $R^1$ to $R^4$ are each independently a $C_1$-$C_8$ monovalent hydrocarbon group, m is an integer of 1 to 100, a, b, c and d are numbers in the range: $0 \le a \le 1$, $0 \le b \le 1$, $0 \le c \le 1$, $0 \le d \le 1$, $0 < a+b \le 1$, and $a+b+c+d=1$, X is a divalent organic group of the formula (2) and Y is a divalent organic group of the formula (3):

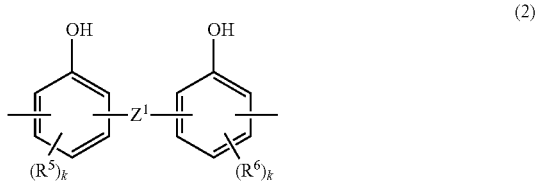

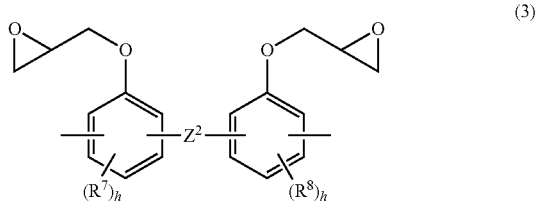

wherein $Z^1$ and $Z^2$ are each independently a single bond or a divalent organic group selected from the following:

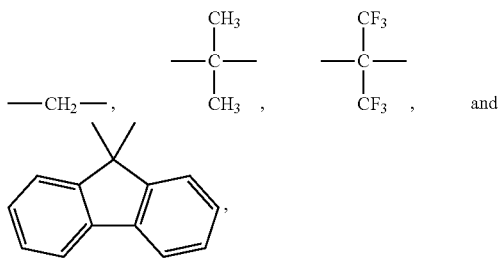

$R^5$ to $R^8$ are each independently a $C_1$-$C_4$ alkyl or alkoxy group, k and h are each independently 0, 1 or 2, (B) a polyhydric phenol compound having at least 3 hydroxyl groups, (C) a photoacid generator which is decomposed to generate an acid upon exposure to radiation of wavelength 190 to 500 nm, and (D) at least one crosslinker selected from the group consisting of an amino condensate modified with formaldehyde or formaldehyde-alcohol, a phenol compound having on the average at least two methylol or alkoxymethylol groups in the molecule, and a polyhydric phenol compound having a hydroxyl group replaced by a glycidoxy group.

In a preferred embodiment, the chemically amplified negative resist layer is formed of a resin composition comprising components (A) to (D), defined above, and (G) a solvent.

Advantageous Effects of Invention

The film material of the invention ensures that the pattern profile of openings in the chemically amplified negative resist material is significantly improved from T-top to rectangular shape. The pattern forming process enables to improve the profile of openings in the chemically amplified negative resist material pattern. This enables formation of a fine pattern in a broad wavelength region and pattern miniaturization in the redistribution technology associated with the demand for higher density and higher integration of chips.

DESCRIPTION OF PREFERRED EMBODIMENTS

The terms "a" and "an" herein do not denote a limitation of quantity, but rather denote the presence of at least one of the referenced item. "Optional" or "optionally" means that the subsequently described event of circumstance may or may not occur, and that the description includes instances where the event occurs and instances where it does not. As used herein, the notation ($C_n$-$C_m$) means a group containing from n to m carbon atoms per group.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure baking
PAG: photoacid generator Film Material One embodiment of the invention is a film material comprising a support film having a transmittance of at least 60% with respect to light of wavelength 300 to 450 nm, and a resin layer disposed on one surface of the support film, containing 0.001 to 10% by weight of a basic compound with a molecular weight of up to 10,000, and having a thickness of 1 to 100 μm.

Suitable basic compounds with a molecular weight of up to 10,000 include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives. The molecular weight of the basic compound is preferably at least 15, more preferably at least 100, and up to 2,000, more preferably up to 1,500.

Examples of suitable primary aliphatic amines include ammonia, methylamine, ethylamine, n-propylamine, isopropylamine, n-butylamine, isobutylamine, sec-butylamine, tert-butylamine, pentylamine, tert-pentylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

Examples of suitable tertiary aliphatic amines include trimethylamine, triethylamine, tri-n-propylamine, triisopropylamine, tri-n-butylamine, triisobutylamine, tri-sec-butylamine, tripentylamine, triethanolamine, tert-butyldicthanolamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramcthyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylanilne, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrrolino), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of suitable nitrogen-containing compounds having sulfonyl group include 3-pyridinesulfonic acid and pyridinium p-toluenesulfonate.

Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide.

Suitable imide derivatives include phthalimide, succinimide, and maleimide.

In addition, basic compounds of the following formula (5) may also be included alone or in admixture.

$$(R^{11})_p\text{—N—}(R^{12})_{3-p} \quad (5)$$

In formula (5), p is equal to 1, 2 or 3. $R^{11}$ is independently selected from substituent groups of the following formulas (6) to (8). $R^{12}$ is hydrogen or a $C_1$-$C_{20}$ straight, branched or cyclic alkyl group which may contain a hydroxyl moiety or ether bond. When two or three groups $R^{11}$ are included, two groups $R^{11}$ may bond together to form a ring with the nitrogen atom to which they are attached. When two or three groups $R^{11}$ are included, they may be the same or different. When two or three groups $R^{12}$ are included, they may be the same or different.

(6)

(7)

(8)

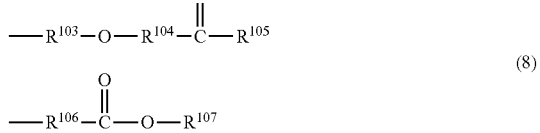

In formulas (6) to (8), $R^{101}$, $R^{103}$ and $R^{106}$ are independently a $C_1$-$C_4$ straight or branched alkylene group. $R^{102}$ and $R^{105}$ are independently hydrogen, or a $C_1$-$C_{20}$ straight, branched or cyclic alkyl group which may contain at least one hydroxyl, ether bond, ester bond or lactone ring. $R^{104}$ is a single bond or a $C_1$-$C_4$ straight or branched alkylene group. $R^{107}$ is a $C_1$-$C_{20}$ straight, branched or cyclic alkyl group which may contain at least one hydroxyl, ether bond, eater bond or lactone ring.

Illustrative examples of the basic compounds of formula (5) include tris(2 methoxymethoxyethyl)amine, tris{2-(2-methoxyethoxy)ethyl}amine, tris{2-(2-methoxyethoxymethoxy)ethyl}amine, tris{2-(1-methoxyethoxy)

ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(valeryloxyethyl)amine, tris(2-pivaloyloxyethyl)amine, N,N-bis(2-acetoxyethyl) 2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[(2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamin, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycabonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2 (2-oxopropoxycarbonyl)ethylamine, N,N-bis(2-acetoxyethyl)-2-(2-oxopropoxycarbonyl)ethylamine, N,N-bis(2-hydroxyethyl-2-(tetrahydrofurfuryloxycabonyl)ethylamine, N,N-bis(2-acetoxyethyl)-2-(tetrahydrofurfuryloxycabonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N bis(2-formyloxyethyl)-2-(4-formyloxybutoxycarbonyl)ethylamine, N,N-bis(2-formyloxyethyl)-2 (2-formyloxybutoxycarbonyl)ethylamine, N,N-bis(2-methoxyethyl)-2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propy)bis[2-(methoxycarbonyl)ethyl]amine, N-(3-acetoxy-1-propyl)bis[2-(methoxycarbonyl)ethyl]amine, N-(2-methoxyethyl)bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis(methoxycarbonylmethyl)amine, N-hexylbis(methoxycarbonylmethyl)amine, and β-(diethylamino)-δ-valerolactone.

From the aspect of sensitivity, the basic compound is present in an amount of 0.001 to 10% by weight, preferably 0.003 to 5% by weight based on the resin layer. Outside the range, a too much amount of the basic compound may detract from the resolution of a chemically amplified negative resist layer contiguous to the resin layer, causing degradation of a pattern at the surface of an exposed region. The basic compounds may be used alone or in admixture of two or more.

The resin on which the basic compound-containing resin layer is based is not particularly limited as long as it is compatible with the basic compound. Typical resins include epoxy resins, phenolic resins, acrylic resins, silicone resins, polyester resins, polyurethane resins and polyimide resins. Inter alia, silicone resins are preferred, with siloxane skeleton-containing polymers having the formula (1) used in the chemically amplified negative resist layer (to be described later) being more preferred.

The basic compound-containing resin layer has a thickness of up to 100 μm, preferably 1 to 100 μm, more preferably 5 to 50 μm, and even more preferably 10 to 30 μm. A resin layer in excess of 100 μm makes it difficult to form a pattern in the resist layer.

The support film may be a single layer or a multilayer film. The support film should have a transmittance of at least 60% with respect to light of wavelength 300 to 450 nm. A support film having a transmittance of less than 60% substantially detracts from the sensitivity of the resist layer, interfering with patter formation.

The support film may be any of synthetic resin films such as polyethylene, polypropylene, polycarbonate and polyethylene terephthalate (PET). Of these, PET having transmittance, adequate flexibility, mechanical strength, and heat resistance is preferred. These films may be pretreated such as corona treatment or release agent coating. Commercially available films are useful, for example, Cerapeel WZ(RX) and Cerapeel BX8(R) (Toray Advanced Film Co., Ltd.), E7302 and E7304 (Toyobo Co., Ltd.), Purex G31 and Purex G71T1 (Teijin DuPont Film Co., Ltd.), PET38x1-A3, PET38x1-V8 and PFF38x1-X08 (Nippa Corp.).

The film material may further include a protective film on the basic compound-containing resin layer. The protective film may be the same as the support film while PET and polyethylene films having adequate flexibility are preferred. Commercially available films are useful. Examples of the PET film are as described above, and suitable polyethylene films include OF-8 (Tamapoly Co., Ltd.) and PB film 0 type (Nippa Corp.).

Preferably the film material has a thickness of 5 to 150 μm, more preferably 10 to 100 μm.

The film material may be prepared by applying a resin composition comprising the resin and the basic compound onto one surface of the support film to form a resin layer thereon.

The resin composition preferably contains an organic solvent in addition to the resin and the basic compound. The organic solvent may be any of well-known solvents including ketones such as cyclohexanone, cyclopentanone and methyl-2-n-pentylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether, and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, and γ-butyrolactone. These solvents may be used alone or in combinations of two or more. The solvent is preferably used in an amount of 10 to 1,000 parts, more preferably 30 to 200 parts by weight per 100 parts by weight of the resin and the basic compound combined. When the resin composition is formed into a film, the content of the solvent in the film is preferably 0 to 30 parts, more preferably 0 to 15 parts by weight per 100 parts by weight of the resin and the basic compound combined.

For coating, a film coater system including a supply roll, a coater head and a take-up roll is typically used. After the support film is unwound from the supply roll and passed through the coater head, the resin composition is applied onto the support film at a predetermined coating weight (i.e., thickness), the coated support film is passed through a hot air circulating oven at a predetermined temperature for a predetermined time, where the coating is dried to form a resin layer on the support film. The resin layer-bearing support film is passed between laminating rolls along with a protective film unwound from another supply roll, for thereby attaching the protective film to the resin layer. Thereafter, the overall film is wound on the take-up roll, obtaining a film roll. Preferably, the hot air circulating oven is at a temperature of 25 to 150° C., the passage time is 1 to 100 minutes, and the laminating roll pressure is 0.01 to 5 MPa.

The film coater system used herein may be any of film coaters commonly used for the preparation of pressure-sensitive adhesive products. Suitable film coaters include a comma coater, comma reverse coater, multi-coater, die coater, lip coater, lip reverse coater, direct gravure coater, offset gravure coater, three bottom reverse coater, and four bottom reverse coater.

Pattern Forming Process

Another embodiment of the invention is a pattern forming process comprising the steps of attaching the resin layer in the film material to a negative resist layer on a wafer, exposing the resist layer to radiation, baking the exposed resist layer, and developing the baked resist layer.

The preferred means for attaching the film material to the wafer is a vacuum laminator. The film material is mounted on the film attachment apparatus. The protective film is peeled to expose the resin layer. In a vacuum chamber at a predetermined vacuum and on a table at a predetermined temperature, the bare resin layer is brought in close contact with the chemically amplified negative resist layer on a substrate, by moving an attachment roll under a predetermined pressure. Typically the table temperature is 60 to 120° C., the attachment roll pressure is 0 to 5.0 MPa, the chamber vacuum is 50 to 500 Pa. The vacuum lamination is preferred in that no voids are generated between the film material and the chemically amplified negative resist layer.

The film material is aligned with the desired pattern, before it is brought in close contact with the chemically amplified negative resist layer. The film material may have the same area as the substrate or cover the overall substrate.

The film material may be used as a correction film after the support film is peeled off, or with the support film retained as such.

Next, the substrate having the chemically amplified negative resist layer bearing the basic compound-containing resin layer thereon is subjected to patterning by lithography via a mask. The patterning process includes exposure, PEB, development, and optionally post-curing to complete patterning. That is, pattern formation may be performed by the standard lithography.

Before the basic compound-containing film material is laminated, the chemically amplified negative resist layer may be prebaked, if necessary, for the purpose of efficient photo-curing reaction of the resist layer or improving the flatness of the resist layer. The prebake may be, for example, at 40 to 140° C. for 1 minute to 1 hour.

Next, the resist layer is exposed through a photomask to radiation of wavelength 190 to 500 nm to cure the resist layer. The photomask may have a desired pattern perforated therein. The material of which the photomask is made is a material capable of shielding radiation of wavelength 190 to 500 an, for example, chromium, but not limited thereto.

Examples of radiation of wavelength 190 to 500 nm include radiation of various wavelength generated by a radiation emitter, such as U V (e.g., g-line, i-line) and deep-UV (248 am, 193 nm). Preferred is radiation of wavelength 300 to 450 m. The exposure dose is preferably 10 to 3,000 mJ/cm$^2$. By exposure, the exposed region of the resist layer is crosslinked to form a pattern which is insoluble in the developer (to be described below).

To increase development sensitivity, PEB is performed, for example, at 40 to 140° C. for 0.5 to 10 minutes.

The exposed resist layer is developed in a developer. The developer may be any of well-known developers, for example, organic solvents such as 2-propanol (IPA) and propylene glycol monomethyl ether acetate (PGMEA). The organic solvent development, however, is regarded undesirable when the disposal of used developer after development and environmental load are taken into account. Organic solvent developers are expensive. For these reasons, use may also be made of alkaline aqueous solutions, typically tetramethylammonium hydroxide (TMAH) aqueous solution which is inexpensive and commonly used in the lithography patterning. The pattern forming process of the invention favors the use of organic solvents. In the development step, the inventive film layer for correcting the pattern profile is removed because it is not curable.

Development may be performed by standard techniques, for example, by immersing the pattern-bearing substrate in the developer. This is followed by optional steps such as cleaning, rinsing and drying, yielding the chemically amplified negative resist layer having the desired pattern.

In conjunction with the progress of semiconductor devices toward small size, low profile and multilayer structure, there is a tendency that the interlayer dielectric layer becomes thinner. When the flatness and step coverage on an irregular substrate are taken into account, the thickness of the resist layer is preferably 10 to 100 μm, more preferably 10 to 70 μm, and even more preferably 10 to 50 μm.

In a preferred embodiment, development is followed by bake, for thereby curing the pattern obtained by patterning of the chemically amplified negative resist layer. The pattern resulting from the above patterning process is baked in an oven or on a hotplate, preferably at 100 to 250° C., more preferably 150 to 220° C., even more preferably 170 to 190° C. for post-curing. A post-curing temperature of 100 to 250° C. is effective for increasing the crosslinking density of the chemically amplified negative resist layer and removing any residual volatile components, which is advantageous from the aspects of bonding force to substrate, heat resistance, strength, and electric properties. The post-curing time may be 10 minutes to 10 hours.

The chemically amplified negative resist layer preferably comprises a siloxane skeleton-containing resin with a weight average molecular weight (Mw) of 3,000 to 500,000.

More preferably the chemically amplified negative resist layer comprises:

(A) a siloxane skeleton-containing polymer represented by the formula (1) and having a Mw of 3,000 to 500,000,

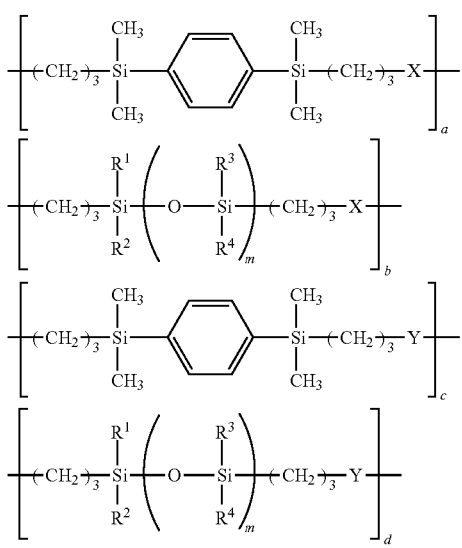

(1)

(2)

(3)

wherein $R^1$ to $R^4$ are each independently a $C_1$-$C_8$ monovalent hydrocarbon group, m is an integer of 1 to 100, a, b, c and d are numbers in the range: $0 \le a \le 1$, $0 \le b \le 1$, $0 \le c \le 1$, $0 \le d \le 1$, $0 < a+b \le 1$, and $a+b+c+d=1$, X is a divalent organic group of the formula (2) and Y is a divalent organic group of the formula (3):

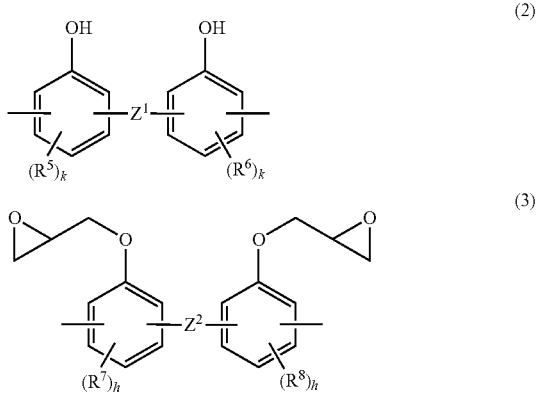

wherein $Z^1$ and $Z^2$ are each independently a single bond or a divalent organic group selected from the following:

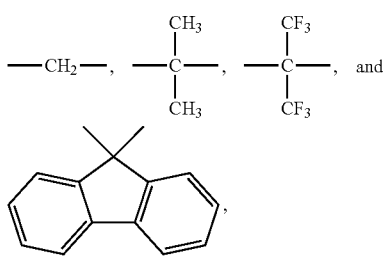

$R^5$ to $R^8$ are each independently a $C_1$-$C_4$ alkyl or alkoxy group, k and h are each independently 0, 1 or 2, (B) a polyhydric phenol compound having at least 3 hydroxyl groups, (C) a photoacid generator which is decomposed to generate an acid upon exposure to radiation of wavelength 190 to 500 nm, and (D) at least one crosslinker selected from among an amino condensate modified with formaldehyde or formaldehyde-alcohol, a phenol compound having on the average at least two methylol or alkoxymethylol groups in the molecule, and a polyhydric phenol compound having a hydroxyl group replaced by a glycidoxy group.

In formula (1), suitable monovalent hydrocarbon groups include alkyl groups such as methyl and ethyl, and aryl groups such as phenyl. Preferably, a, b, c and d are numbers in the range: $0.05 \le a \le 0.9$, $0.05 \le b \le 0.9$, $0 < c \le 0.7$, and $0 < d \le 0.7$.

The siloxane skeleton-containing polymer as component (A) should preferably have a Mw of 3,000 to 500,000 and more preferably 5,000 to 200,000. The polymer may be used alone or in admixture of two or more.

Component (B) is a polyhydric phenol compound having at least 3 hydroxyl groups. Examples include phenol, bisphenol A, alkylphenols such as p-tert-butylphenol, octylphenol, and p-cumylphenol, resole and novolak type phenolic resins obtained from such reactants as p-phenylphenol and cresol, which may be used alone or in admixture.

Component (B) is preferably used in an amount of 0.5 to 50 parts, more preferably 1 to 30 parts by weight per 100 parts by weight of component (A).

Component (C) is a photoacid generator which is not particularly limited as long as it is decomposed to generate an acid upon exposure to radiation of wavelength 190 to 500 nm. Suitable photoacid generators include onium salts, diazomethane derivatives, glyoxime derivatives, β-ketosulfone derivatives, disulfone derivatives, nitrobenzyl sulfonate derivatives, sulfonic acid ester derivatives, imido-yl sulfonate derivatives, oxime sulfonate derivatives, imino sulfonate derivatives, and triazine derivatives, which may be used alone or in admixture.

Component (C) is preferably used in an amount of 0.05 to 20 parts, more preferably 0.2 to 5 parts by weight per 100 parts by weight of component (A).

Component (D) is a crosslinker. Suitable amino condensates modified with formaldehyde or formaldehyde-alcohol include melamine condensates modified with formaldehyde or formaldehyde-alcohol, and urea condensates modified with formaldehyde or formaldehyde-alcohol. Suitable phenol compounds having on the average at least two methylol or alkoxymethylol groups in the molecule include (2-hydroxy-5-methyl)-1,3-benzenedimethanol and 2,2',6,6'-tetramethoxymethylbisphenol A. A polyhydric phenol compound having a hydroxyl group replaced by a glycidoxy group is also useful. The crosslinker may be used alone or in admixture.

Component (D) is preferably used in an amount of 0 to 50 parts, more preferably 1 to 30 parts by weight per 100 parts by weight of component (A).

The chemically amplified negative resist layer may further comprise (E) a cure accelerator. When the siloxane skeleton-containing polymer contains an epoxy group, the cure accelerator (E) has a function of accelerating the cure rate of the polymer. Suitable cure accelerators include tertiary amines and salts thereof, and imidazoles, which may be used alone or in admixture.

Component (B) is preferably used in an amount of 0 to 3 parts, more preferably 0 to 1 part by weight per 100 parts by weight of component (A).

The chemically amplified negative resist layer may further comprise (F) a basic compound. The basic compound (F) is preferably the same as the basic compound in the film material, and may be used alone or in admixture.

Component (F) is preferably used in an amount of 0 to 5 parts, more preferably 0.01 to 3 parts by weight per 100 parts by weight of component (A).

The chemically amplified negative resist layer may be formed by attaching a dry film comprising components (A) to (D) and optional components (B) and (F) to a wafer, or by using a chemically amplified negative resist composition comprising components (A) to (D), optional components (E) and (F), and solvent (G).

The solvent (G) is not particularly limited as long as components (A) to (D) are soluble therein. Suitable solvents include ketones such as cyclohexanone, cyclopentanone and methyl-2-n-pentylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, and γ-butyrolactone. These solvents may be used alone or in combinations of two or more thereof.

The solvent (G) is preferably used in an amount of 50 to 2,000 parts, more preferably 100 to 1,000 parts by weight per 100 parts by weight of components (A) to (D) combined.

EXAMPLE

Examples of the invention are given below by way of illustration and not by way of limitation. All parts are by weight. Mw stands for weight average molecular weight as measured by GPC versus polystyrene standards using tetrahydrofuran solvent. The compounds M-1 through M-7 used in Synthesis Examples have the structural formulae shown below.

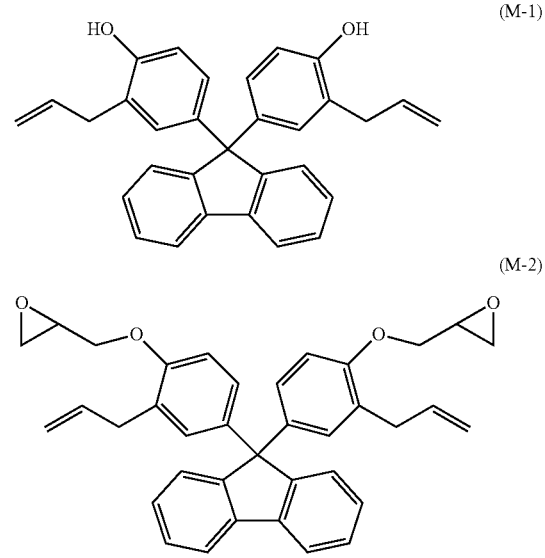

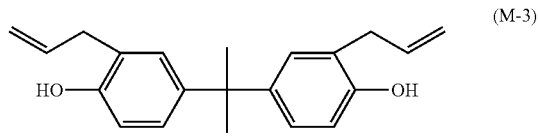

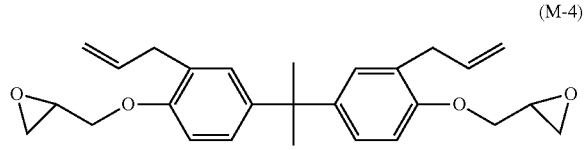

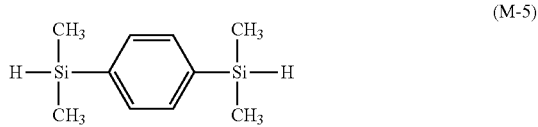

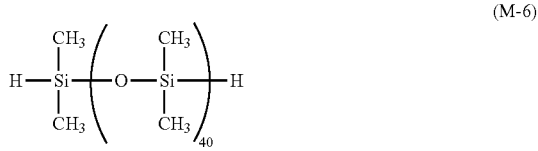

Synthesis Example 1

A 5-L flask equipped with a stirrer, thermometer, nitrogen purging line and reflux condenser was charged with 1,875 g of toluene, then with 405.0 g of compound M-1 and 40.0 g of compound M-4, and after dissolution, further with 949.6 g of compound M-6 and 6.1 g of compound M-7. The flask was heated at 60° C., and 2.2 g of a platinum-on-carbon catalyst (5 wt %) was added. It was observed that the interior reaction temperature rose to 65-67° C., after which the reaction solution was ripened for 3 hours. The reaction solution was cooled to 60° C., 2.2 g of a platinum-on-carbon catalyst (5 wt %) was added, and 107.5 g of compound M-5 was added dropwise over one hour. This time the flask interior temperature rose to 78° C. After the dropwise addition, the reaction solution was ripened for 1.5 hours at 90° C. The reaction solution was cooled down to room temperature, combined with 1,700 g of methyl isobutyl ketone (MIBK), and filtered through a filter under pressure to remove the platinum catalyst. To the polymer solution was added 760 g of deionized water. The combined solution was agitated and allowed to stand for separation, after which the lower or aqueous layer was removed. This water washing/separating operation was repeated 6 times until the minute acid fraction was removed from the polymer solution. The solvent was distilled off in vacuum and instead, 950 g of cyclopentanone was added to the polymer solution. This yielded a solution of polymer (A-1) mainly in cyclopentanone having a solid concentration of 60 wt %. The polymer (A-1) had a structure of the following formula and a Mw of 31,000. The compositional ratio of repeating units was computed from the amounts of reactants. In the formula, m is 1 or 40.

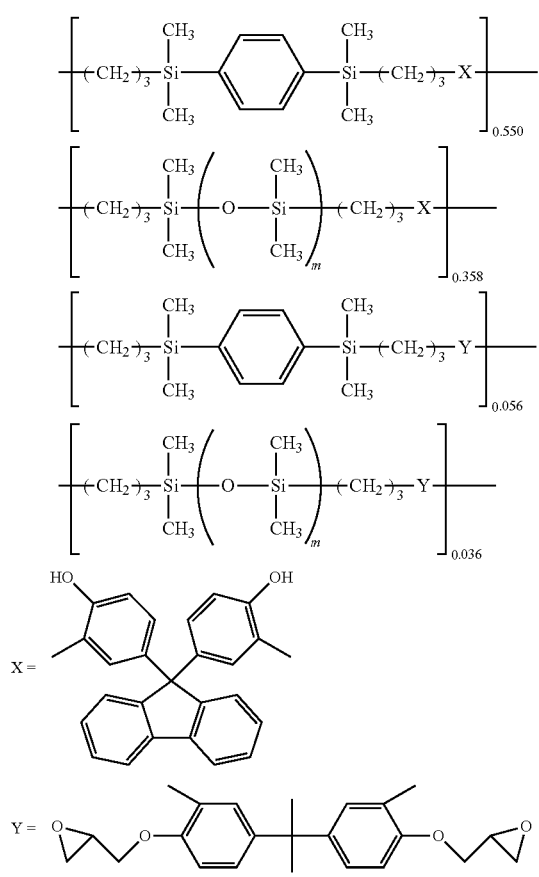

Synthesis Example 2

A 5-L Flask Equipped with a Stirrer, Thermometer, Nitrogen Purging Line and Reflux condenser was charged with 2,000 g of toluene, then with 325.0 g of compound M-1 and 150.0 g of compound M-2, and after dissolution, further with 949.6 g of compound M-6 and 6.1 g of compound M-7. The flask was heated at 60° C., and 2.2 g of a platinum-on-carbon catalyst (5 wt %) was added. It was observed that the interior reaction temperature rose to 65-67° C., after which the reaction solution was ripened for 3 hours. The reaction solution was cooled to 60° C., 2.2 g of a platinum-on-carbon catalyst (5 wt %) was added, and 107.5 g of compound M-5 was added dropwise over one hour. This time the flask interior temperature rose to 80° C. After the dropwise addition, the reaction solution was ripened for 3 hours at 90° C. The reaction solution was cooled down to room temperature, combined with 1,800 g of MIBK, and filtered through a filter under pressure to remove the platinum catalyst. To the polymer solution was added 760 g of deionized water. The combined solution was agitated and allowed to stand for separation, after which the lower or aqueous layer was removed. This water washing/separating operation was repeated 6 times until the minute acid fraction was removed from the polymer solution. The solvent was distilled off in vacuum and instead, 900 g of cyclopentanone was added to the polymer solution. This yielded a solution of polymer (A-2) mainly in cyclopentanone having a solid concentration of 60 wt %. The polymer (A-2) had a structure of the following formula and a Mw of 55,000. The compositional ratio of repeating units was computed from the amounts of reactants. In the formula, m is 1 or 40.

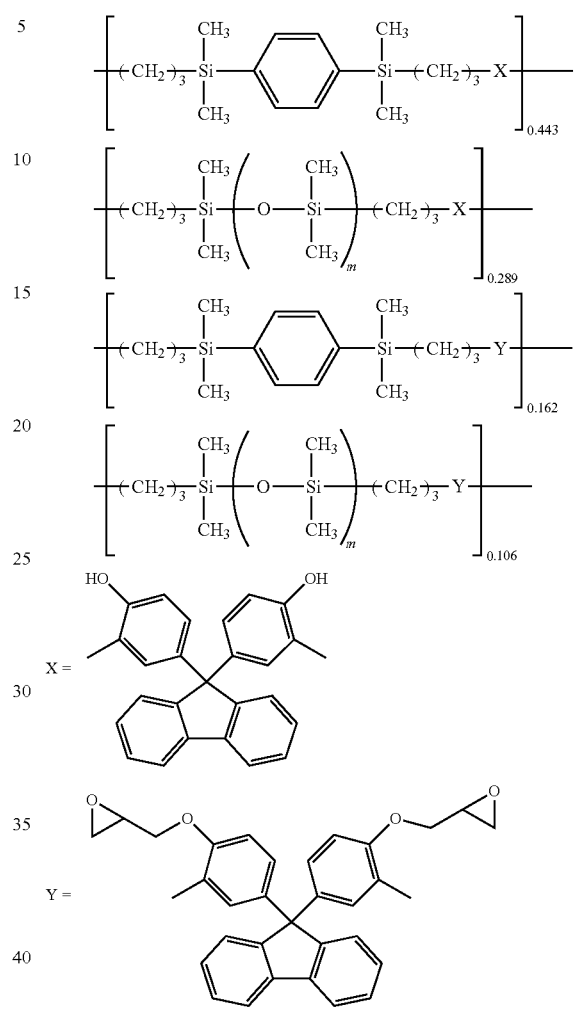

Synthesis Example 3

A 5-L flask equipped with a stirrer, thermometer, nitrogen purging line and reflux condenser was charged with 1,875 g of toluene, then with 405.0 g of compound M-2 and 80.0 g of compound M-3, and after dissolution, further with 949.6 g of compound M-6 and 6.1 g of compound M-7. After the flask was heated at 60° C., 2.2 g of a platinum-on-carbon catalyst (5 wt %) was added. It was observed that the interior reaction temperature rose to 65-67° C., after which the reaction solution was ripened for 3 hours at 90° C. The reaction solution was cooled to 60° C., 2.2 g of a platinum-on-carbon catalyst (5 wt %) was added, and 107.5 g of compound M-5 was added dropwise over one hour. This time the flask interior temperature rose to 80° C. After the dropwise addition, the reaction solution was ripened for 8 hours at 90° C. The reaction solution was cooled down to room temperature, combined with 1,700 g of MIBK, and filtered through a filter under pressure to remove the platinum catalyst. To the polymer solution was added 760 g of deionized water. The combined solution was agitated and allowed to stand for separation, after which the lower or aqueous layer was removed. This water washing/separating operation was repeated 6 times until the minute acid fraction was removed from the polymer solution. The solvent was distilled off in vacuum and instead, 950 g of cyclopentanone was added to the polymer solution. This yielded a solution of polymer (A-3) mainly in cyclopentanone having a solid concentration of 60 wt %. The polymer (A-3) had a structure of the following formula and a Mw of 73,000. The compositional ratio of repeating units was computed from the amounts of reactants. In the formula, m is 1 or 40.

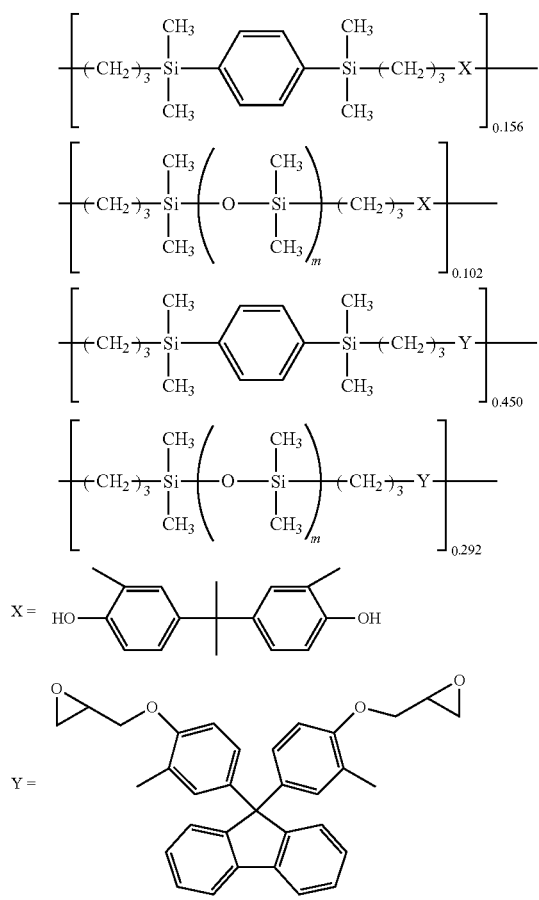

Preparation Examples 1 to 4

Preparation of Resist Composition

Resist compositions R1 to R4 were prepared by combining the polymer, polyhydric phenol compound, photoacid generator, crosslinker, cure accelerator, and solvent according to the formulation shown in Table 1, stirring, mixing and dissolving at room temperature, and precision filtering through a Teflon® filter with a pore size of 0.2 μm.

TABLE 1

| | | Resist composition | Polymer (pbw) | PAG (pbw) | Crosslinker (pbw) | Polyhydric phenol compound (pbw) | Cure accelerator (pbw) | Solvent (pbw) |
|---|---|---|---|---|---|---|---|---|
| Preparation Example | 1 | R1 | A-1 (100) | PAG-2 (2) | XL-1 (15) | PH-1 (15) | U-CAT5002 (0.1) | cyclopentanone (55) |
| | 2 | R2 | A-2 (100) | PAG-1 (1) | XL-1 (15) | PH-2 (15) | | cyclopentanone (55) |
| | 3 | R3 | A-3 (100) | PAG-1 (1) | XL-1 (15) | PH-3 (15) | | cyclopentanone (55) |
| | 4 | R4 | A-1 (100) | PAG-1 (1) | XL-1 (15) | PH-1 (15) | | cyclopentanone (55) |

The photoacid generators PAG-1 and PAG-2, crosslinker XL-1, and polyhydric phenol compounds PH-1 to PH-3 in Table 1 are identified below.

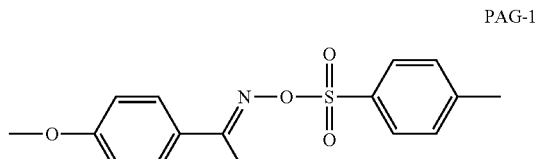

PAG-1

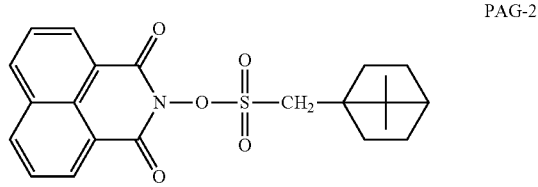

PAG-2

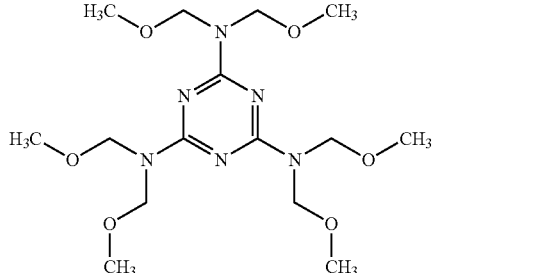

XL-1

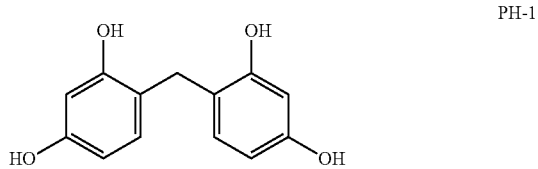

PH-1

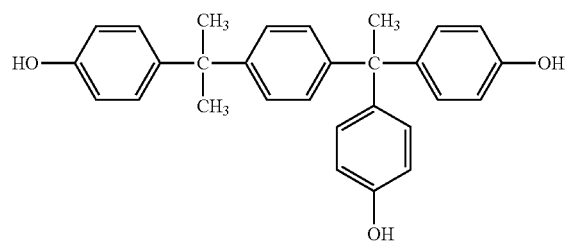

PH-2

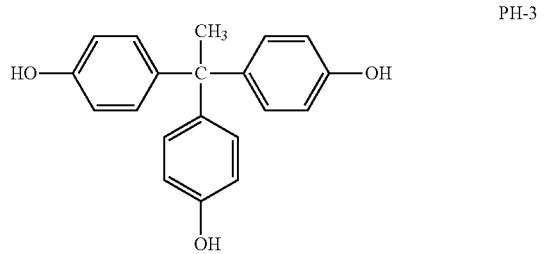

PH-3

The cure accelerator in Table 1 is U-CAT 5002 (DBU base tetraphenylborate by San-Apro Ltd.).

Preparation Examples 5 to 15

Preparation of Resin Layer-Forming Composition

Resin layer-forming compositions B1 to B11 were prepared by combining the polymer, basic compound, and solvent according to the formulation shown in Table 2, stirring, mixing and dissolving at room temperature, and precision filtering through a Teflon® filter with a pore size of 0.2 μm.

TABLE 2

| | | Resin layer-forming composition | Polymer (pbw) | Basic compound (pbw) | Solvent (pbw) |
|---|---|---|---|---|---|
| Preparation Example | 5 | B1 | A-1 (93) | AM-1 (1) | cyclopentanone (55) |
| | 6 | B2 | A-1 (95) | AM-1 (5) | cyclopentanone (55) |
| | 7 | B3 | A-1 (95) | AM-2 (5) | cyclopentanone (55) |
| | 8 | B4 | A-2 (99.997) | AM-3 (0.003) | cyclopentanone (55) |
| | 9 | B5 | A-3 (99.95) | AM-1 (0.05) | cyclopentanone (55) |
| | 10 | B6 | A-2 (88) | AM-1 (12) | cyclopentanone (55) |
| | 11 | B7 | A-1 (100) | — | cyclopentanone (55) |
| | 12 | B8 | A-3 (99.95) | AM-4 (0.05) | cyclopentanone (55) |
| | 13 | B9 | A-3 (99.95) | AM-5 (0.05) | cyclopentanone (55) |

TABLE 2-continued

| | | Resin layer-forming composition | Polymer (pbw) | Basic compound (pbw) | Solvent (pbw) |
|---|---|---|---|---|---|
| | 14 | B10 | A-3 (99.95) | AM-6 (0.05) | cyclopentanone (55) |
| | 15 | B11 | A-3 (99.95) | AM-7 (0.05) | cyclopentanone (55) |

The basic compounds in Table 2 are identified below.

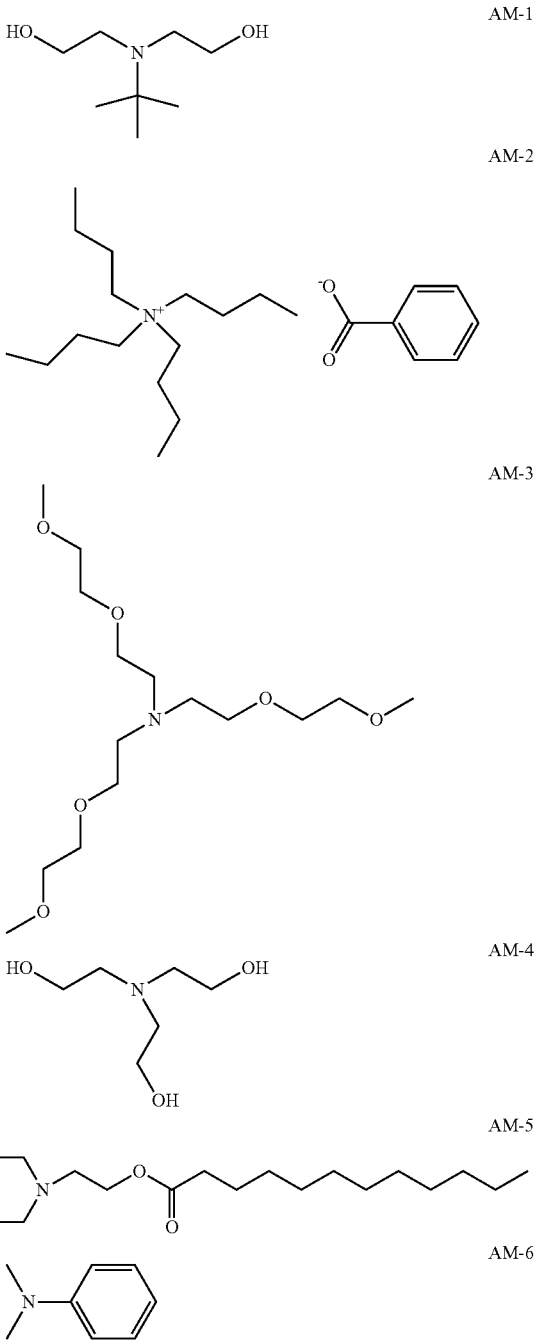

-continued

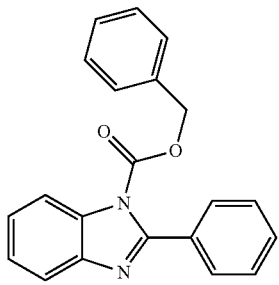

AM-7

Examples 1 to 9 and Comparative Examples 1 to 2

Using a die coater, each of resin layer-forming compositions B1 to B11 was coated onto a PET film (38 μm thick) as the support film. The coated film was passed through a hot air circulating oven (length 4 m) at 100° C. over 5 minutes to form a resin layer on the support film. A polyethylene film (50 μm thick) as the protective film was attached to the resin layer under a pressure of 1 MPa, yielding a film material including the resin layer. The thickness of the resin layer is shown in Table 3, as measured by an optical interference film thickness gauge. The light transmittance of the support film was determined by measuring at 15 points by a spectrophotometer U-3000 (Hitachi Ltd.) and computing an average thereof.

Also photo-curable dry films having a negative resist layer were prepared by the same method as above aside from using resist compositions R1 to R4 instead of resin layer-forming compositions B1 to B11.

From the photo-curable dry film, the protective film was stripped off. Using a vacuum laminator TEAM-100RF (Takatori Corp.) with a vacuum chamber set at a vacuum of 80 Pa and a temperature of 110° C., the negative resist layer was closely bonded to a silicon substrate. After restoration of atmospheric pressure, the substrate was taken out of the laminator. The support film was stripped off. The assembly was prebaked on a hotplate at 130° C. for 5 minutes to enhance the bond between the resist layer and the substrate.

From the film material having the resin layer, the protective film was stripped off. Using a vacuum laminator TEAM-100RF (Takatori Corp.) with a vacuum chamber set at a vacuum of 80 Pa, the resin layer was closely bonded to the negative resist layer on the Si substrate. At this point, the support film of the film material was retained. Using a contact aligner type exposure system with a mask for forming a hole pattern with a diameter of 100 μm, the resist layer was exposed to radiation of 405 nm in a dose of 1,000 mJ/cm$^2$ to form a pattern.

After the exposure, the support film was stripped. The resist layer was baked (PEB) on a hotplate at 120° C. for 5 minutes, cooled, and developed by spraying PGMEA for 300 seconds. While an oven was purged with nitrogen, the patterned resist layer was post-cured by heating in the oven at 180° C. for 2 hours. When the pattern was formed using the film material, the profile of openings and the results of pattern formation are shown in Tables 3 and 4. The pattern profile was observed under SEM. The patterns in Examples were rectangular and not T-top shaped.

TABLE 3

| | | Example | | | | | Comparative Example | |
|---|---|---|---|---|---|---|---|---|
| | | 1 | 2 | 3 | 4 | 5 | 1 | 2 |
| Resin layer | Resin layer-forming composition | B1 | B2 | B3 | B4 | B5 | B6 | B7 |
| | Basic compound | AM-1 | AM-1 | AM-2 | AM-3 | AM-1 | AM-1 | — |
| | Thickness of resin layer (μm) | 30 | 15 | 10 | 5 | 10 | 25 | — |
| | Concentration of basic compound (wt %) | 1 | 5 | 0.05 | 0.003 | 0.05 | 12 | — |
| | Average transmittance of support film relative to radiation of wavelength 300-450 nm (%) | 65 | 85 | 68 | 90 | 70 | 85 | 80 |
| Resist layer | Resist composition | R1 | R2 | R2 | R3 | R4 | R1 | R1 |
| | Thickness of resist layer (μm) | 50 | 100 | 100 | 150 | 100 | 100 | 100 |
| | Profile of pattern openings | rectangular | rectangular | rectangular | rectangular | rectangular | extremely rough surface, pattern formation failure | T-top |

TABLE 4

|  |  | Example | | | |
|---|---|---|---|---|---|
|  |  | 6 | 7 | 8 | 9 |
| Resin layer | Resin layer-forming composition | B8 | B9 | B10 | B11 |
|  | Basic compound | AM-4 | AM-5 | AM-6 | AM-7 |
|  | Thickness of resin layer (μm) | 10 | 10 | 10 | 10 |
|  | Concentration of basic compound (wt %) | 0.05 | 0.05 | 0.05 | 0.05 |
|  | Average transmittance of support film relative to radiation of wavelength 300-450 nm (%) | 70 | 70 | 70 | 70 |
| Resist layer | Resist composition | R4 | R4 | R4 | R4 |
|  | Thickness of resist layer (μm) | 100 | 100 | 100 | 100 |
|  | Profile of pattern openings | rectangular | rectangular | rectangular | rectangular |

Japanese Patent Application No. 2016-202294 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of:
attaching a film material via a resin layer to a chemically amplified negative resist layer on a wafer,
exposing the resist layer to radiation,
baking the exposed resist layer, and
developing the baked resist layer,
wherein the film material comprises a support film having a transmittance of at least 60% with respect to light of wavelength 300 to 450 nm, and the resin layer disposed on one surface of the support film, the resin layer containing 0.001 to 10% by weight of a basic compound with a molecular weight of up to 10,000, and the resin layer having a thickness of 1 to 100 μm.

2. The pattern forming process of claim 1 wherein the radiation used in the exposure step is radiation of wavelength 190 to 500 nm.

3. The pattern forming process of claim 1 wherein the chemically amplified negative resist layer comprises a siloxane skeleton-containing resin with a weight average molecular weight of 3,000 to 500,000.

4. The pattern forming process of claim 1 wherein the chemically amplified negative resist layer comprises
(A) a siloxane skeleton-containing polymer represented by the formula (1) and having a weight average molecular weight of 3,000 to 500,000,

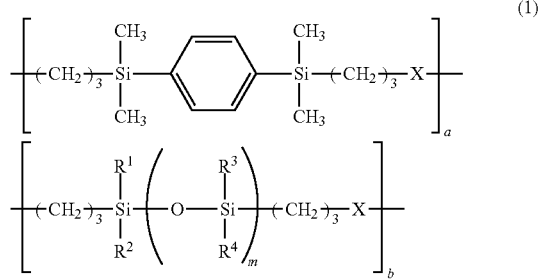

(1)

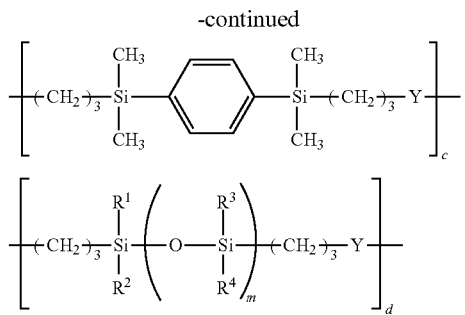

wherein $R^1$ to $R^4$ are each independently a $C_1$-$C_8$ monovalent hydrocarbon group, m is an integer of 1 to 100, a, b, c and d are numbers in the range: $0 \le a \le 1$, $0 \le b \le 1$, $0 \le c \le 1$, $0 \le d \le 1$, $0 < a+b \le 1$, and $a+b+c+d=1$, X is a divalent organic group of the formula (2) and Y is a divalent organic group of the formula (3):

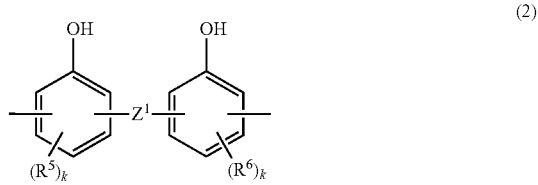

(2)

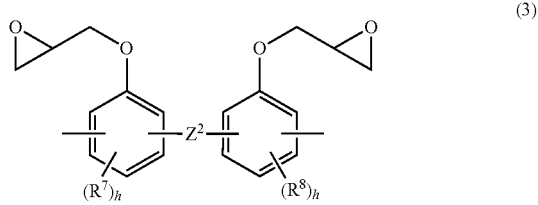

(3)

wherein $Z^1$ and $Z^2$ are each independently a single bond or a divalent organic group selected from the following:

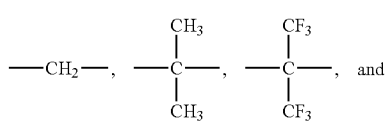

-continued

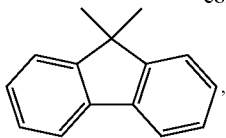

$R^5$ to $R^8$ are each independently a $C_1$-$C_4$ alkyl or alkoxy group, k and h are each independently 0, 1 or 2, (B) a polyhydric phenol compound having at least 3 hydroxyl groups,
(C) a photoacid generator which is decomposed to generate an acid upon exposure to radiation of wavelength 190 to 500 nm, and
(D) at least one crosslinker selected from the group consisting of an amino condensate modified with formaldehyde or formaldehyde-alcohol, a phenol compound having on the average at least two methylol or alkoxymethylol groups in the molecule, and a polyhydric phenol compound having a hydroxyl group replaced by a glycidoxy group.

5. The pattern forming process of claim 1 wherein the chemically amplified negative resist layer is formed of a resin composition comprising:

(A) a siloxane skeleton-containing polymer represented by the formula (1) and having a weight average molecular weight of 3,000 to 500,000,

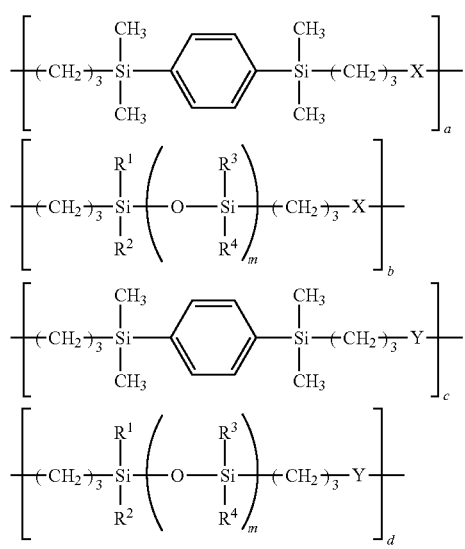

wherein $R^1$ to $R^4$ are each independently a $C_1$-$C_8$ monovalent hydrocarbon group, m is an integer of 1 to 100, a, b, c and d are numbers in the range: $0 \leq a \leq 1$, $0 \leq b \leq 1$, $0 \leq c \leq 1$, $0 \leq d \leq 1$, $0 < a+b \leq 1$, and $a+b+c+d=1$, X is a divalent organic group of the formula (2) and Y is a divalent organic group of the formula (3):

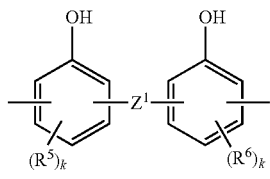

wherein $Z^1$ and $Z^2$ are each independently a single bond or a divalent organic group selected from the following:

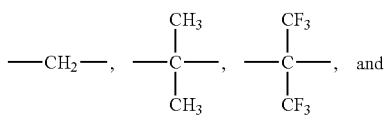

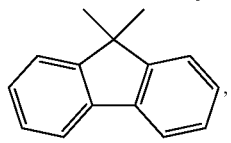

$R^5$ to $R^8$ are each independently a $C_1$-$C_4$ alkyl or alkoxy group, k and h are each independently 0, 1 or 2, (B) a polyhydric phenol compound having at least 3 hydroxyl groups,
(C) a photoacid generator which is decomposed to generate an acid upon exposure to radiation of wavelength 190 to 500 nm,
(D) at least one crosslinker selected from the group consisting of an amino condensate modified with formaldehyde or formaldehyde-alcohol, a phenol compound having on the average at least two methylol or alkoxymethylol groups in the molecule, and a polyhydric phenol compound having a hydroxyl group replaced by a glycidoxy group, and
(G) a solvent.

6. The pattern forming process of claim 1 wherein the resin layer comprises a resin selected from the group consisting of an epoxy resin, phenolic resin, acrylic resin, silicone resin, polyester resin, polyurethane resin and polyimide resin.

7. The pattern forming process of claim 6 wherein the resin layer comprises a siloxane skeleton containing resin with a weight average molecular weight of 3,000 to 500,000.

* * * * *